(12) United States Patent
Liu

(10) Patent No.: US 10,256,815 B2
(45) Date of Patent: Apr. 9, 2019

(54) FINGER SENSING DEVICE AND METHOD

(71) Applicant: Texas Instruments Incorporated, Dallas, TX (US)

(72) Inventor: Dongtai Liu, Fremont, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/791,330

(22) Filed: Jul. 3, 2015

(65) Prior Publication Data
US 2016/0142052 A1 May 19, 2016

Related U.S. Application Data

(60) Provisional application No. 62/020,104, filed on Jul. 2, 2014.

(51) Int. Cl.
*H03K 17/96* (2006.01)

(52) U.S. Cl.
CPC . *H03K 17/962* (2013.01); *H03K 2217/96066* (2013.01); *H03K 2217/960755* (2013.01)

(58) Field of Classification Search
CPC ..... H03K 17/962; H03K 2217/960755; H03K 2217/96066
USPC .......................................................... 200/600
See application file for complete search history.

(56) References Cited

U.S. PATENT DOCUMENTS

| | | |
|---|---|---|
| 2003/0028346 A1 | 2/2003 | Sinclair et al. |
| 2009/0101416 A1 | 4/2009 | Chuang |
| 2011/0267302 A1 | 11/2011 | Fasshauer |
| 2012/0306802 A1 | 12/2012 | McCracken |
| 2013/0050130 A1 | 2/2013 | Brown |
| 2013/0270095 A1* | 10/2013 | Yau .......................... G06F 3/044 200/600 |
| 2014/0160641 A1* | 6/2014 | Chuang ................... G06F 3/044 361/679.01 |

OTHER PUBLICATIONS

U.S. Appl. No. 14/673,870, entitled "Capacitive Position Sensing With Pressure Compensation Using Dual-Electrode Sensor", filed Mar. 30, 2015.
PCT Search Report, for Application No. PCT/US 2015/023681, dated Aug. 6, 2015.

* cited by examiner

*Primary Examiner* — Edwin A. Leon
*Assistant Examiner* — Lheiren Mae A Caroc
(74) *Attorney, Agent, or Firm* — Andrew Viger; Charles A. Brill; Frank D. Cimino

(57) ABSTRACT

A finger sensing device includes a first conductive plate, wherein the area between the finger and the first conductive plate increases in response to the finger moving in a first direction proximate the first conductive plate. A second conductive plate is located proximate the first conductive plate, wherein the area between the finger and the second conductive plate decreases in response to the finger moving in the first direction proximate the second conductive plate. A first capacitance detector is coupled to the first conductive plate for measuring a first capacitance between the finger and the first conductive plate. A second capacitance detector is coupled to the second conductive plate for measuring a second capacitance between the finger and the second conductive plate.

6 Claims, 4 Drawing Sheets

FINGER SENSING DEVICE AND METHOD

This application claims priority to U.S. provisional patent application 62/020,104 for FINGER MOVEMENT SENSING WITH A PAIR OF CAPACITANCE SENSOR of Dongtai Liu filed on Jul. 2, 2014, which is incorporated for all that is disclosed.

BACKGROUND

Finger sensing devices determine the position of a finger relative to a surface of the device. For example, the finger contacts the device and moves relative to the surface of the device and the device determines the location of the finger. Some finger sensors have a plurality of individual capacitive plates wherein the presence of a finger induces capacitance between some of the plates and the finger. Each of the plates has a capacitance sensor coupled thereto, which measures the induced capacitance. By measuring the capacitance on all the plates, the location of the finger is determined. These devices require a plurality of individual capacitive plates and a separate sensor coupled to each plate. Higher sensitivity is achieved by having a high number of capacitive plates in the device, which is very costly. Therefore, a need exists for a finger sensor having minimal capacitive plates and sensors, but having high sensitivity.

SUMMARY

A finger sensing device includes a first conductive plate, wherein the area between the finger and the first conductive plate increases in response to the finger moving in a first direction proximate the first conductive plate. A second conductive plate is located proximate the first conductive plate, wherein the area between the finger and the second conductive plate decreases in response to the finger moving in the first direction proximate the second conductive plate. A first capacitance detector is coupled to the first conductive plate for measuring a first capacitance between the finger and the first conductive plate. A second capacitance detector is coupled to the second conductive plate for measuring a second capacitance between the finger and the second conductive plate.

In some examples, the first and/or second conductive plates have triangular shapes. Edges of the triangular-shaped conductive plates may be adjacent each other. Some triangular-shaped conductive plates are right angles wherein the hypotenuses of the right angles are adjacent each other.

In other examples, the first conductive plate has a plurality of first conductive portions having different areas wherein the areas of the first conductive portions increase toward the first direction. The second conductive plate has a second plurality of conductive portions having different areas the areas of the second conductive portions decrease in the first direction.

Some examples of the device include a processor that is coupled to the first capacitance detector and the second capacitance detector. The processor determines at least one characteristic between the finger and the device in response to the first capacitance and the second capacitance. The characteristic may be the position of the finger relative to at least one of the first conductive plate and the second conductive plate. The position of the finger may be determined in response to the ratio of the first capacitance and the second capacitance or the difference between the first capacitance and the second capacitance. In other examples, the characteristic is the acceleration of the finger relative to at least one of the first conductive plate and the second conductive plate. The acceleration of the finger may be determined in response to the time derivative of the ratio of the first capacitance and the second capacitance or the time derivative of the difference between the first capacitance and the second capacitance. In other examples, the characteristic is the pressure applied by the finger on at least one of the first conductive plate and the second conductive plate, which may be determined in response to the sum of the first capacitance and the second capacitance.

Methods of determining at least one of finger position, finger acceleration, and finger pressure of a finger relative to a first conductive plate and a second conductive plate, wherein the first conductive plate is located proximate the second conductive plate are disclosed. An example of the method includes measuring a first capacitance induced on the first conductive plate by the finger; measuring a second capacitance induced on the second conductive plate by the finger; and determining at least one of finger position, finger acceleration, and finger pressure of the finger in response to the first capacitance and the second capacitance. The determining includes: determining the finger position in response to the ratio of the first capacitance and the second capacitance; determining the finger acceleration in response to the time derivative of the ratio of the first capacitance and the second capacitance; and determining the finger pressure in response to the sum of the first capacitance and the second capacitance.

Another finger sensing device includes a first conductive plate in the shape of a right triangle, wherein the area between the finger and the first conductive plate increases in response to the finger moving in a first direction proximate the first conductive plate. A second conductive plate is in the shape of a right triangle, wherein the hypotenuse of the first conductive plate is located proximate the hypotenuse of the second conductive plate. The area between the finger and the second conductive plate decreases in response to the finger moving in the first direction proximate the second conductive plate. A first capacitance detector is coupled to the first conductive plate for measuring a first capacitance between the finger and the first conductive plate. A second capacitance detector coupled to the second conductive plate for measuring a second capacitance between the finger and the second conductive plate.

DETAILED DESCRIPTION

Figure 1:
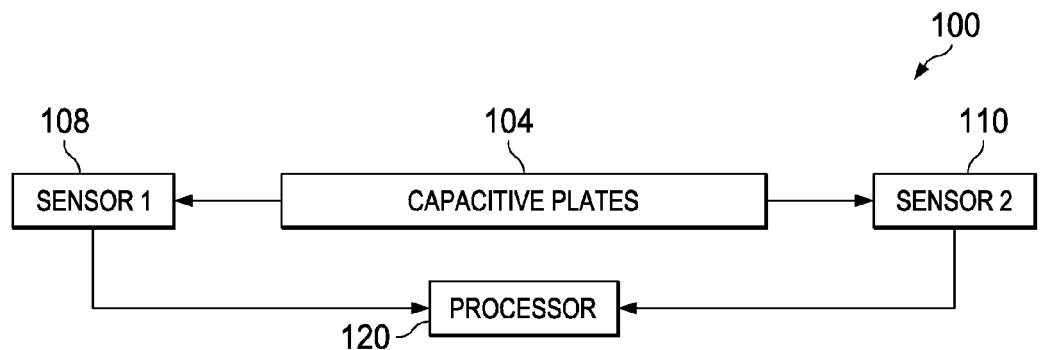
FIG. 1 is a system diagram of an exemplary finger sensing device.

FIG. 1 is a system diagram of an exemplary finger sensing device 100. The device 100 described herein senses the location, pressure, and movement of a finger (not shown in FIG. 1), however, the device 100 can sense the location, pressure, and movement of other objects that induce capacitance as described herein. The device 100 has a capacitive device 104 on which a finger may be located. The finger induces capacitance on the capacitive device 104 as described herein and the device 100 determines the location, pressure, and movement of the finger relative to the capacitive device 104. In some examples, the device 100 may only determine one or two characteristics of finger location, finger pressure, and finger movement.

A first capacitance sensor 108 is electrically coupled to a first conductive plate (not shown in FIG. 1) within the capacitive device 104 and a second capacitance sensor 110 is electrically coupled to a second conductive plate (not shown in FIG. 1) within the capacitive device 104. The sensors 108 and 110 measure the capacitances on the first and second conductive plates resulting from a finger being located proximate the plates. The first and second sensors 108 and 110 are coupled to a processor 120 that receives data indicative of the capacitances measured by the sensors 108 and 110. The capacitances induced on the capacitive device 104 are analyzed by the processor 120 to determine the location, pressure, and movement of the finger.

Figure 2:
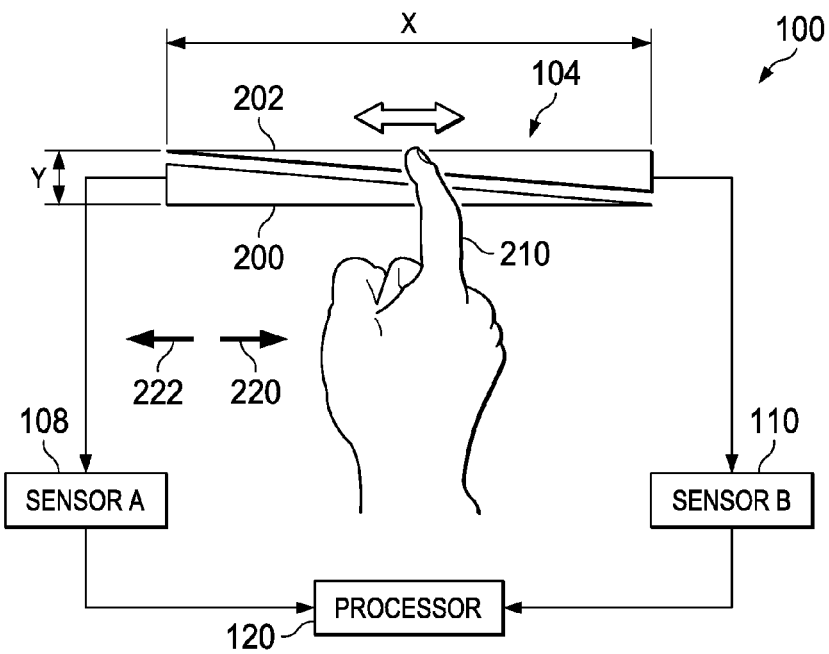
FIG. 2 is a top plan view of an exemplary finger sensing device.

FIG. 2 is a top plan view of an exemplary finger sensing device 100. The capacitive device 104 has a first conductive plate 200 and a second conductive plate 202. When the device 100 is in use, a finger 210 or other object that can induce capacitance is located proximate the first and second plates 200 and 202 so as to generate capacitance between the finger 210 and the conductive plates 200 and 202. The finger 210 induces a first capacitance with the first conductive plate 200 and a second capacitance with the second conductive plate 202. The exemplary capacitive device 104 is a rectangular structure having a height Y and a length X, which is sometimes referred to as extending along an x axis. The length X of the capacitive device 104 may be much larger than the height Y. The dimensions illustrated in FIG. 2 relative to the finger 210 are for illustration only and may not accurately represent the dimensions of all examples of capacitive devices. For example, the height Y may be much smaller than the length along the x-axis that the finger 210 contacts.

The capacitive device 104 includes the first and second conductive plates 200 and 202, which in the example of FIG. 2 are both right triangles wherein the hypotenuses of the right triangles face each other. The first capacitance induced by the finger 210 and the first conductive plate 200 is unique for every location of the finger 210 along the x-axis. Likewise, the second capacitance induced by the finger 210 and the second conductive plate 202 is unique for every location of the finger 210 along the x-axis. For example, as the finger 210 moves in a direction 220, which is sometimes referred to as the positive x direction, the area covered by the finger 210 on the first conductive plate 200 decreases, so the induced capacitance decreases. At the same time, the area covered by the finger 210 on the second conductive plate 202 increases, so the induced capacitance increases. As the finger 210 moves in a direction 222, which is sometimes referred to as the negative x direction, the area covered by the finger 210 on the first conductive plate 200 increases, so the induced capacitance increases. At the same time, the area covered by the finger 210 on the second conductive plate 202 decreases, so the induced capacitance decreases.

The processor 120 receives the capacitance measurements from the first sensor 108 and the second sensor 110 and determines the location, direction, and movement of the finger 210 relative to the capacitance device 104. For example, the ratio of the first capacitance to the second capacitance yields the location of the finger 210 relative to the capacitance device 104. The pressure applied by the finger 210 on the capacitive device 104 will increase the capacitance on both the first and second capacitive plates 200 and 202 simultaneously, which can be determined by the processor 104 as described in greater detail below. The rate of change of the capacitances induced between the finger 210 and the first and second conductive plates 200 and 202 is proportional to the velocity of the finger 210 along the x-axis.

Figure 3:
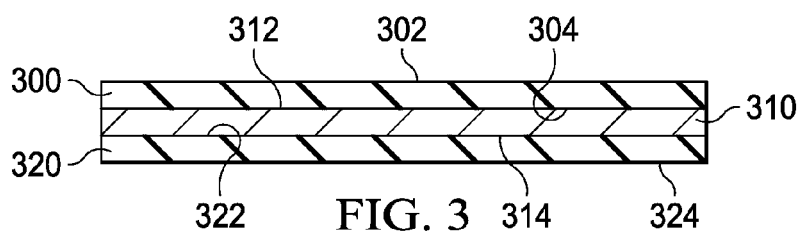
FIG. 3 is a side view of a capacitive device of FIG. 2.
Figure 4:
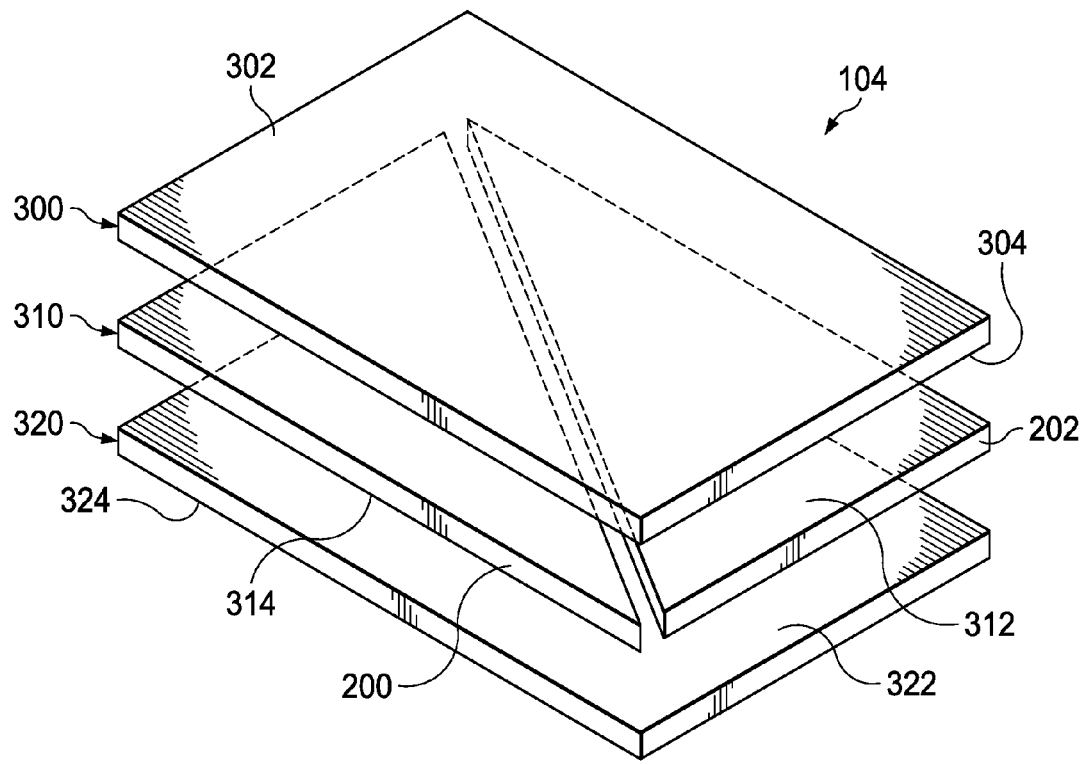
FIG. 4 is a top isometric view of the capacitive device of FIG. 2.

FIG. 3 is a side view of the capacitive device 104 of FIG. 2 and FIG. 4 is a top isometric view of the capacitive device 104 of FIG. 2. The capacitive device 104 has an insulation layer 300 that has a top surface 302 and a bottom surface 304. The terms "top" and "bottom" are only references to the relative locations of components in the capacitive device 104 and do not infer that the capacitive device 104 may only be used with a top surface facing a specific direction. A conductive layer 310 is located below the insulation layer 300 and has a top surface 312 and a bottom surface 314. The conductive layer 310 is in two sections, the first conductive plate 200 and the second conductive plate 202, as described with reference to FIG. 2. An insulation layer 320 is located below the conductive layer 310 and has a top surface 322 and a bottom surface 324. The top surface 312 abuts the bottom surface 304 and the top surface 322 abuts the bottom surface 314. The insulation layer 300 serves as a dielectric between the finger 210, FIG. 2, and the conductive layer 310. The insulation layer 320 prevents the conductive layer 310 from shorting to components within a device in which the capacitance device 104 is located.

Figure 5:
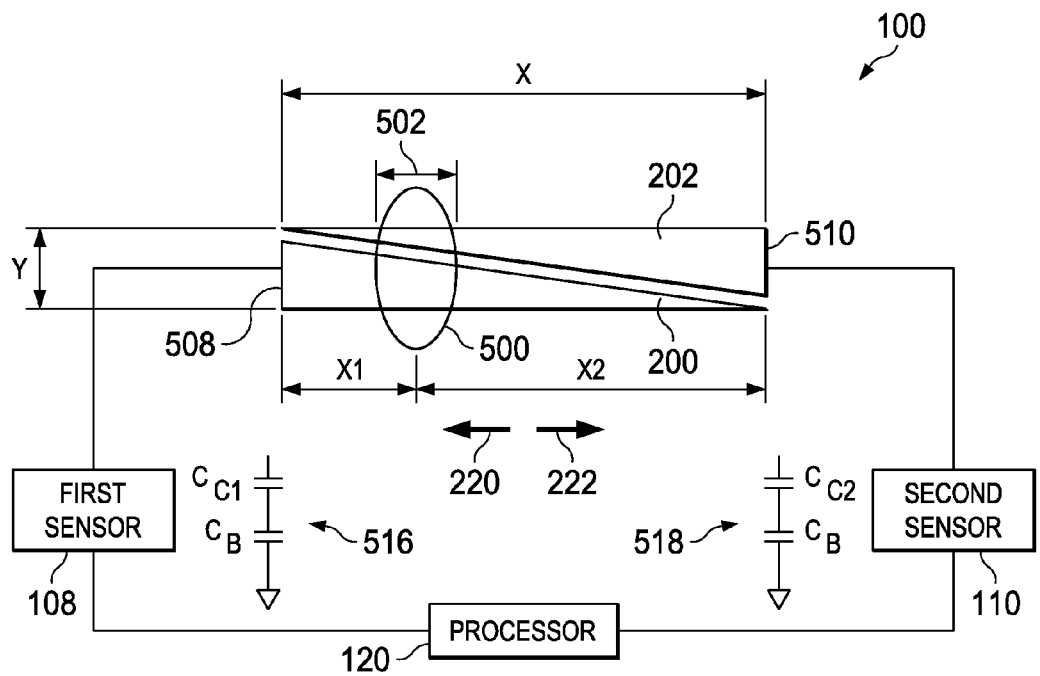
FIG. 5 is a schematic diagram of the finger sensing device of FIG. 2 showing the capacitances seen by a first sensor and a second sensor.

The operation of the example device 100 will now be described. FIG. 5 is a schematic diagram of the device 100 showing the capacitances seen by both the first sensor 108 and the second sensor 110. FIG. 5 shows a contact area 500 having a width 502. The contact area 500 is located a distance X1 from a first side 508 of the capacitive device 104 and a distance X2 from a second side 510 of the capacitive device 104. The contact area 500 represents the area where a finger (not shown in FIG. 5) contacts the capacitive device 104 or becomes in close enough proximity to the conductive plates 200 and 202 to induce the first and second capacitances described herein. The width 502 is the width of the contact area 500. By reducing the height Y of the capacitive device 104, the boundaries of the contact area 500 over the conductive plates 200 and 202 become substantially parallel lines. Accordingly, the area of each of the conductive plates 200 and 202 contacted by a finger becomes directly proportional to the distances X2 and X2, respectively.

The induced capacitance resulting from the finger being a plate of a capacitor with the first and second conductive plates 200 and 202 is referred to as the contact capacitance. A first contact capacitance $C_{C1}$ results from the finger being proximate the first conductive plate 200 and a second contact capacitance $C_{C2}$ results from the finger being proximate the second conductive plate 202. The body of the person touching the capacitive device 104 has a body capacitance $C_B$, which is in series with the respective contact capacitance. A first circuit 516 is an equivalent circuit of the capacitance $C_{S1}$ detected or seen by the first sensor 108 and a second circuit 518 is an equivalent circuit of the capacitance $C_{S2}$ detected or seen by the second sensor 110. The capacitance $C_{S1}$ is given by equation (1) as follows:

$$C_{S1} = C_{C1} \frac{C_B}{C_{C1} + C_B} \qquad \text{Equation (1)}$$

Because the body capacitance $C_B$ is much greater than the contact capacitance, $C_{S1}$ is substantially equal to $C_{C1}$. Likewise, $C_{S2}$ is substantially equal to $C_{C2}$. In some examples, the sensed capacitances $C_{S1}$ and $C_{S2}$ are more accurate in systems having a ground wherein a user holds or otherwise contacts the ground during use of the device 100.

Based on the sensed capacitances $C_{S1}$ and $C_{S2}$, the device 100 may be used to determine the position of the finger, direction of finger movement, and change in the force applied by the finger. The position of the finger can be extracted from the ratio of $C_{S1}$ and $C_{S2}$ or the difference between $C_{S1}$ and $C_{S2}$. The direction of the finger movement can be extracted from the time derivative of either $C_{S1}$ or $C_{S2}$. The pressure exerted by the finger can be extracted from the product of $C_{S1}$ and $C_{S2}$ or the sum of $C_{S1}$ and $C_{S2}$.

Figure 6:
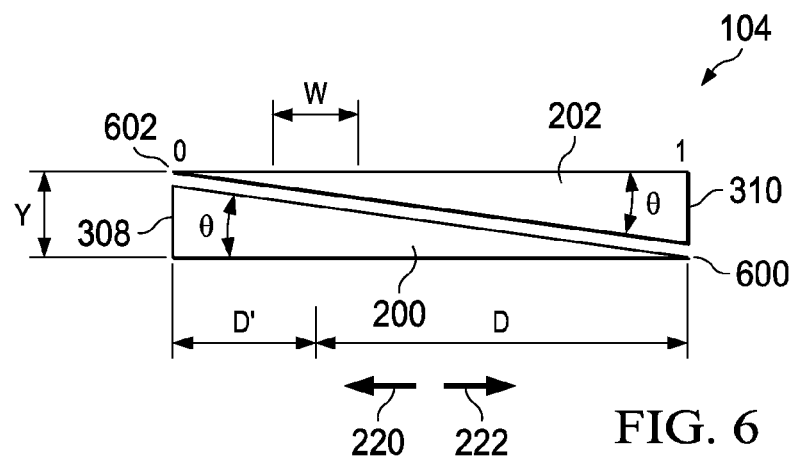
FIG. 6 is a diagram showing a geometric model of the conductive plates in the finger sensing device of FIG. 2.

Reference is made to FIG. 6, which shows geometric models of the first and second conductive plates 200 and 202 that help illustrate the correlation between the capacitances $C_{S1}$ and $C_{S2}$ and the location of the finger on the capacitance device 104. In the example of FIG. 6, the finger has contacted the insulating layer 300, FIG. 3, above the first and second conductive plates 200 and 202 with a width W. As described above, the conductive plates 200 and 202 have very low heights Y, so the finger contacts both conductive plates 200 and 202 with equal widths W. The center of the finger has contacted the insulating layer 300 above the first conductive plate 200 a distance D from an edge 600 of the first conductive plate 200. The finger has contacted the insulating layer 300 above the second conductive plate 202 a distance D' from an edge 602 of the second conductive plate 202. Because the distance X is normalized to one, the distance D' is equal to 1−D. The area A of contact of the finger relative to the first conductive plate 200 is given by equation (2) as follows:

$$A=(D+0.5\ W)^2 * \tan(\theta) - (D-0.5\ W)^2 * \tan(\theta) \qquad \text{Equation (2)}$$

The area A reduces to equation 3:

$$A = 2\ DW \tan\theta \qquad \text{Equation (3)}$$

Equation (3) is written as a constant K (equal to 2 W tan θ) multiplied by D, for an equation wherein the area is equal to the product of K and D. With regard to the second conductive plate 202, the area is equal to the product of K and D', which is equal to the product of K and (1−D). The contact capacitance $C_{C1}$ of the first conductive plate 200 is proportional to the area (KD) and the capacitance $C_{C2}$ of the second conductive plate 202 is proportional to the area K(1−D). The distance D can be calculated by solving for the ratio of $C_{C1}$ and $C_{C2}$ per equation (4) as follows:

$$\frac{C_{C1}}{C_{C2}} = \frac{1}{D} - 1 \qquad \text{Equation (4)}$$

The values of $C_{C1}$ and $C_{C2}$ are measured by the sensors 108 and 110 of FIG. 5, so the distance D is readily calculated by solving equation (4) for D. The solution for D does not involve any variables other than measuring the capacitances $C_{C1}$ and $C_{C2}$. The distance D is also proportional to the difference between $C_{C1}$ and $C_{C2}$. The rate of change in the distance D is determined from the time derivative of the distance D, which is proportional to the time derivatives of $C_{C1}$ and $C_{C2}$. The direction of the finger movement is also readily calculated by the sign of the time derivatives. For example, an increasing value of capacitance $C_{C1}$ indicates movement in the direction 220.

Figure 7A:
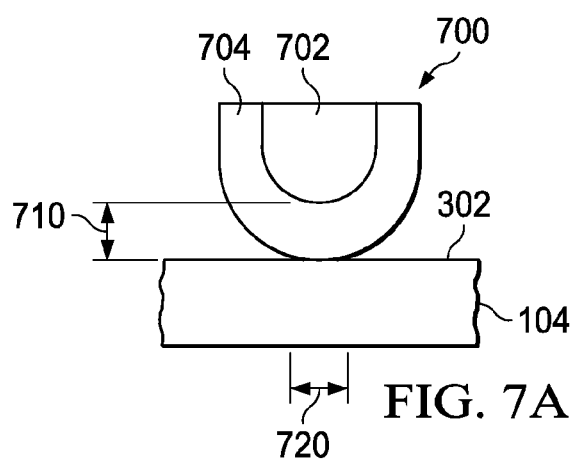
FIG. 7A is a side cutaway view of a finger pressing lightly on the finger sensing device of FIG. 3.
Figure 7B:
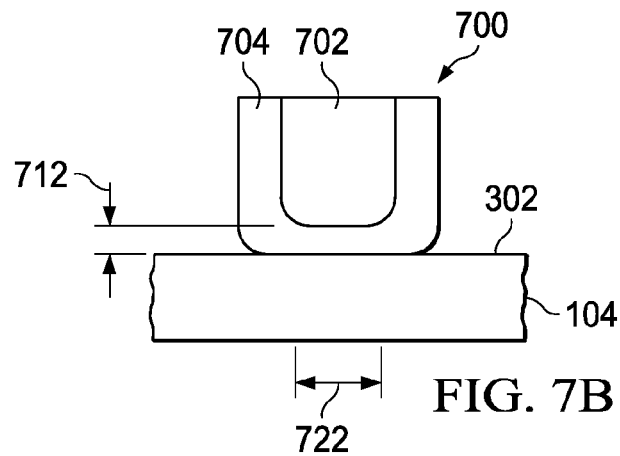
FIG. 7B is a side cutaway view of the finger of FIG. 7A being pressed harder on the finger sensing device of FIG. 3.

FIG. 7A is a side cutaway view of a finger 700 pressing lightly on the surface 302 of the capacitance device 104 of FIG. 3 and FIG. 7B is a side cutaway view of the finger 700 being pressed harder on the surface 302 of the capacitance device 104. The cutaway view of the finger 700 shows more conductive tissues 702, such as blood vessels, and less conductive tissue 704, such as fat tissue. In FIG. 7A, the more conductive tissue 702 is located a distance 710 from the surface 302 and in FIG. 7B, the more conductive tissue is located a distance 712 from the surface 302, wherein the distance 712 is less than the distance 710. In FIG. 7A, the more conductive tissue 702 has an effective width 720 relative to the surface 302 and in FIG. 7B, the more conductive tissue 702 has an effective width 722 relative to the surface 302, wherein the width 722 is greater than the width 720. The closer the more conductive tissue 702 is to the surface 302, the greater the capacitances $C_{C1}$ and $C_{C2}$. In addition, the capacitances $C_{C1}$ and $C_{C2}$ will both increase as the effective width of the more conductive tissue 702 is greater. The calculation for the location of the finger 700 is based on the ratio of $C_{C1}$ and $C_{C2}$, so the application of more or less pressure exerted by the finger 700 will not affect the location calculation because both $C_{C1}$ and $C_{C2}$ increase or decrease with changes in pressure.

The capacitances $C_{C1}$ and $C_{C2}$ as applied to FIG. 7A are less than the capacitances $C_{C1}$ and $C_{C2}$ as applied to FIG. 7B. As the finger 700 transitions from its state in FIG. 7A to the state of FIG. 7B, both the capacitances $C_{C1}$ and $C_{C2}$ increase whereas if the finger 700 were to move laterally relative to the surface 302, one of the capacitances $C_{C1}$ and $C_{C2}$ would increase and the other would decrease. Therefore, the processor 120, FIG. 5, adds the capacitances $C_{C1}$ and $C_{C2}$ together to determine if the sum changes. For example, if the sum increases, then the finger 700 is being pressed harder on the surface 302. If the sum decreases, the finger 700 is exerting less pressure on the surface 302. If the sum is not changing, but the capacitance values $C_{C1}$ and $C_{C2}$ are changing, the finger 700 is moving. If the sum and the capacitances are not changing, the finger 700 is not moving.

The device 100 of FIG. 1 senses finger movement and pressure with only two conductive plates 200 and 202 and only two capacitance sensors 108 and 110. The conductive plates 200 and 202 have been described herein as being triangular so as the finger moves laterally, the capacitance relative to one plate increases and the capacitance relative to the other plate decreases. Other conductive plate configurations that increase the capacitance relative to a first plate and decrease the capacitance relative to another plate as the finger is moved may substitute the triangular conductive plates 200 and 202 described above.

Figure 8:
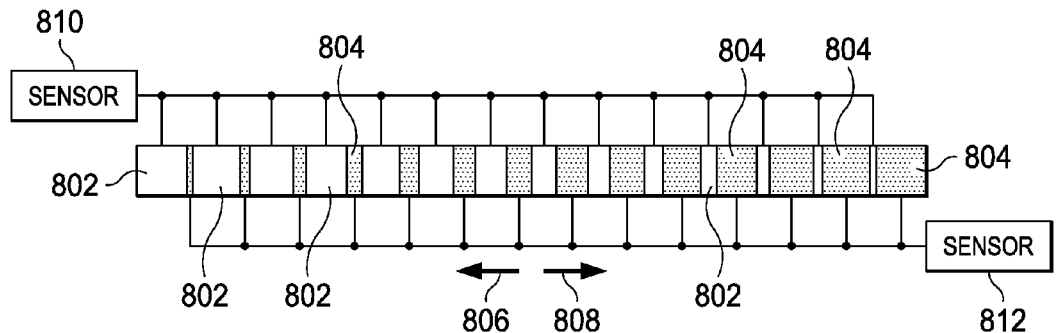
FIG. 8 is a top plan view of another example of conductive plates in the finger sensing device of FIG. 2.

FIG. 8 is an example of discretely-sized conductive plates 800. The conductive plates 800 include first conductive plates 802 and second conductive plates 804. The areas of the first conductive plates 802 increase proportional to a direction 802 and decrease proportional to a direction 808.

The areas of the second conductive plates 804 decrease proportional to the direction 806 and increase proportional to the direction 806. The areas of individual conductive plates are small relative to a finger, so a finger contacting the conductive plates 800 may contact or come into close proximity to several of the first conductive plates 802 and several of the second conductive plates 804. The first conductive plates 802 are coupled to a first capacitance sensor 810 and the second conductive plates 804 are coupled to a second capacitance sensor 812. The capacitance sensors 810 and 812 function in the same or substantially the same manner as the capacitance sensors 108 and 110 of FIG. 5.

Figure 9:
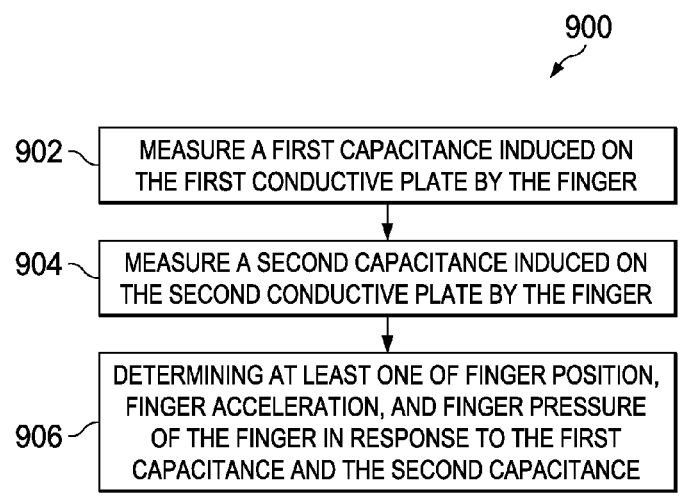
FIG. 9 is a flow chart describing an example method of detecting the finger relative to the finger sensing device of FIG. 2.

FIG. 9 is a flow chart 900 describing an example for determining at least one of finger position, finger acceleration, and finger pressure of a finger relative to the first conductive plate 200, FIG. 2, and the second conductive plate 202. Step 902 includes measuring a first capacitance induced on the first conductive plate 200 by the finger. Step 904 includes measuring a second capacitance induced on the second conductive plate 202 by the finger. Step 906 includes determining at least one of finger position, finger acceleration, and finger pressure of the finger in response to the first capacitance and the second capacitance.

While some examples of finger detectors have been described in detail herein, it is to be understood that the inventive concepts may be otherwise variously embodied and employed and that the appended claims are intended to be construed to include such variations except insofar as limited by the prior art.

What is claimed is:

1. A system for sensing finger position independent of finger pressure along a sensing track, comprising:
   first and second capacitive electrodes arranged in the sensing track, and
      the first capacitive electrode configured with a plurality of conductive first segments, each spaced from respective adjacent first segments along the sensing track, with respective areas that successively increase toward the first direction; and
      the second capacitive electrode configured with a plurality of conductive second segments, spaced from adjacent second segments along the sensing track, and interleaved along the sensing track with the first conductive segments, with areas that successively decrease in the first direction;
   the first and second capacitive electrodes:
      dimensioned such that a finger positioned along the sensing track covers adjacent first and second sensing areas of respectively the first and second capacitive electrodes, and
      configured such that, in response to finger movement in a first direction along the sensing track, the first sensing area increases, and complementarily the second sensing area decreases;
   a first capacitance sensor coupled to the first capacitive electrode for measuring a first capacitance between the finger and the first capacitive electrode based on the first sensing area; and
   a second capacitance sensor coupled to the second capacitive electrode for measuring a second capacitance between the finger and the second capacitive electrode based on the second sensing area;
   a processor coupled to the first and second capacitance sensors to determine:
      finger position along the sensing track as one of a ratio and a difference of the first and second capacitances, independent of
      finger pressure on the sensing track determined as one of a sum and a product of the first and second capacitances.

2. The system of claim 1, wherein the first and second capacitive electrodes have a triangular shape, and are disposed with an hypotenuse of the first capacitive electrode adjacent a hypotenuse of the second capacitive electrode.

3. The system of claim 1, the processor further determining finger acceleration along the sensing track based on a time derivative of one of the ratio and the difference of the first and second capacitances.

4. A method for sensing finger position independent of finger pressure along a sensing track formed by first and second capacitive electrodes that are dimensioned such that a finger positioned along the sensing track covers adjacent first and second sensing areas of respectively the first and second capacitive electrodes, and that are configured such that, in response to finger movement in a first direction along the sensing track, the first sensing area increases, and complementarily the second sensing area decreases, the method comprising:
   measuring a first capacitance between the finger and the first capacitive electrode based on the first sensing area;
   measuring a second capacitance between the finger and the second capacitive electrode based on the second sensing area;
   the first capacitive electrode configured with a plurality of conductive first segments, each spaced from respective adjacent first segments along the sensing track, with respective areas that successively increase toward the first direction; and
   the second capacitive electrode is configured with a plurality of conductive second segments, spaced from adjacent second segments along the sensing track, and interleaved along the sensing track with the first conductive segments, with areas that successively decrease in the first direction; and
   determining a finger position along the sensing track as one of a ratio and a difference of the first and second capacitances, independent of a finger pressure on the sensing track determined as one of a sum and a product of the first and second capacitances.

5. The method of claim 4, further comprising determining finger acceleration along the sensing track based on a time derivative of one of the ratio and the difference of the first capacitance and the second capacitance.

6. The method of claim 4, wherein the first and second capacitive electrodes have a triangular shape, and are disposed with an hypotenuse of the first capacitive electrode adjacent a hypotenuse of the second capacitive electrode.

* * * * *